(12) United States Patent
Lee et al.

(10) Patent No.: US 7,807,215 B2
(45) Date of Patent: Oct. 5, 2010

(54) METHOD OF MANUFACTURING COPPER-CLAD LAMINATE FOR VOP APPLICATION

(75) Inventors: Jong Jin Lee, Daejeon (KR); Young Hwan Shin, Daejeon (KR); Jae Min Choi, Daejeon (KR); Chang Yul Oh, Daejeon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1049 days.

(21) Appl. No.: 11/524,401

(22) Filed: Sep. 21, 2006

(65) Prior Publication Data

US 2008/0073025 A1    Mar. 27, 2008

(51) Int. Cl.
B05D 5/12    (2006.01)
B65B 33/00   (2006.01)

(52) U.S. Cl. .................................. 427/97.7; 427/154
(58) Field of Classification Search ............... 427/97.7
See application file for complete search history.

(56) References Cited

U.S. PATENT DOCUMENTS

2007/0044910 A1* 3/2007 Kuo et al. ................ 156/307.3
2009/0107706 A1* 4/2009 Lee et al. .................... 174/255

FOREIGN PATENT DOCUMENTS

GB       2249219 A  *  4/1992
JP       11-154788      6/1999
JP       2000-68640     3/2000
JP       2001-308548   11/2001
JP       2002-252436    9/2002
JP       2002-324963   11/2002
JP       2003-124632    4/2003
JP       2003-243824    8/2003
JP       2004-31710     1/2004
KR       10-2003-0047088 6/2003

OTHER PUBLICATIONS

Japanese Patent Office Action, mailed May 20, 2008 and issued in corresponding Japanese Patent Application No. 2006-257591.
Japanese Office Action issued on Dec. 16, 2008 in corresponding Japanese Patent Application 2006-257591.

* cited by examiner

Primary Examiner—Brian K Talbot

(57) ABSTRACT

Disclosed herein is a method of manufacturing a copper-clad laminate for Via-On-Pad application. The pad includes the steps of providing a first copper foil layer and a second copper foil layer, on the first surfaces of which protective layers are formed; placing two sets of a first copper foil layer, an insulating layer and a second copper foil layer above and below an adhesive layer, respectively; removing the protective layers, which have been respectively formed on the second copper foil layers, and parts of the second copper foil layers; forming via holes by removing parts of the insulating layers through the regions from which the parts of the second copper foil layers have been removed, using laser processing; and forming two copper-clad laminates by removing the protective layers, which have been respectively formed on one surface of one first copper foil layer and one surface of the other first copper foil layer, and the adhesive layer.

6 Claims, 8 Drawing Sheets

METHOD OF MANUFACTURING COPPER-CLAD LAMINATE FOR VOP APPLICATION

BACKGROUND OF THE INVENTION

1. Field of the Invention

The present invention relates generally to a method of manufacturing a copper-clad laminate for via-on-pad application and, more particularly, to a method of manufacturing a copper-clad laminate for via-on-pad application, which makes possible the manufacture of the copper-clad laminate in which a blind via hole is formed on a super-thin copper foil layer.

2. Description of the Related Art

With the rapid digitization and networking of the electronic industry, the Printed Circuit Board (PCB) technology is being rapidly developed. As complete set companies demand high-frequency band and high-speed signal processing speed specifications, new advanced technologies enabling the design for super-thin foils and fine circuits are required. Several years ago, the circuit line width and interlayer thickness of PCBs each were about 200 µm. However, recently, the circuit width and the interlayer thickness have been each reduced to a thickness equal to or less than 100 µm, thereby the related industries have entered the Nano era. In particular, various new technologies, such as micro-via and build-up technologies, are attracting attention as high value-added technologies for achieving the high integration and super-thinness of package substrates and mobile terminal substrates.

For double-sided PCBs, a Plated Through Hole (PTH) technology of forming through holes and then performing electroless plating and electrolytic copper plating on the through holes has been chiefly used. However, as, recently, the size of packages gradually decreases, the number of chips to be mounted in the limited area of each PCB is rapidly increasing. That is, a Ball Grid Array (BGA)-type double-sided PCB requires a larger number of solder balls to be mounted in the limited area of each PCB. To meet this requirement, the size of solder balls and the distance between solder balls are gradually reduced. That is, the solder ball pitch becomes finer. To implement such a fine ball pitch, a Via-On-Pad (VOP) technology, instead of the PTH technology, is being more widely used. A through via hole formed using the PTH technology functions only to realize interlayer connection, whereas a blind via hole formed using the VOP technology functions to provide a solder ball pad for the mounting of solder balls as well as to realize interlayer connection. Accordingly, the VOP technology has the advantage of significantly reducing the solder ball pitch.

With reference to FIGS. 1A to 1F, a prior art method of manufacturing a copper-clad laminate for VOP application is described below.

First, a copper-clad laminate 4 is formed by arranging copper foil layers 2 and 2' on both surfaces of an insulating layer 1, as illustrated in FIG. 1A, and laminating the elements together, as illustrated in FIG. 1B.

In this case, a protective layer 3 or 3' for protecting the surface of the copper foil layer 2 or 2' during a transport or lamination process is formed on one surface of each of the copper foil layer copper foil layer 2 or 2'.

Furthermore, each of the copper foil layers 2 and 2' is formed to be thicker than 10 µm in view of the heat that is generated during a subsequent laser process.

Thereafter, as illustrated in FIG. 1C, the protective layers 3 and 3' formed on the surfaces of the copper foil layers 2 and 2' are removed.

Next, as illustrated in FIG. 1D, part of the upper copper foil layer 2 is removed using etching or the like, thereby exposing part of the insulating layer 1 outside.

Thereafter, as illustrated in FIG. 1E, the exposed part of the insulating layer 1 is removed using laser processing, thereby forming a blind via hole 5 on which only the lower copper foil layer 2' remains.

Finally, as illustrated in FIG. 1F, a plating layer 6 for providing conductivity is formed on the inside of the via hole 5, thereby realizing a copper-clad laminate for VOP application.

The above-described prior art copper-clad laminate for VOP application has a problem in that, to prevent the copper foil layer 2' from being damaged by the heat generated during laser processing that is performed to form the via hole 5, the thickness of each of the copper foil layers 2 and 2' must be maintained greater than a specific thickness.

FIG. 2 is a sectional view of a copper-clad laminate for VOP application, which is formed using the prior art method of manufacturing a copper-clad laminate for VOP application, when the copper foil layers 2 and 2' each have a thickness equal to or less than 5 µm. With reference to this drawing, the above-described problem is further described below.

As illustrated in FIG. 2, when, to form a fine circuit pattern, each of the copper foil layers 2 or 2' is formed to be thinner than 5 µm and laser processing is performed, heat generated in a laser beam is not sufficiently dissipated, therefore the insulating layer 1 is removed and a pin hole A or the like is generated in the lower copper foil layer 2'.

Accordingly, since each of the copper foil layers 2 and 2' must be thicker than the specific thickness in order to prevent the above problem, there occurs a problem in that it is difficult to manufacture a copper-clad laminate for VOP application for the implementation of a fine circuit pattern using the prior art method of manufacturing a copper-clad laminate for VOP application.

SUMMARY OF THE INVENTION

Accordingly, the present invention has been made keeping in mind the above problems occurring in the prior art, and an object of the present invention is to provide a method of manufacturing a copper-clad laminate for VOP application, which makes possible the formation of a blind via hole on a copper foil layer that enables the implementation of a fine circuit.

In order to accomplish the above object, the present invention provides a method of manufacturing a copper-clad laminate for VOP application, including providing a first copper foil layer and a second copper foil layer, wherein the first copper foil layer has a first protective layer on one surface thereof, and the second copper foil layer has a second protective layer on one surface thereof; placing two sets of a first copper foil layer having a second protective layer, an insulating layer and a second copper foil layer having a second protective layer above and below an adhesive layer, respectively so that the first copper foil layer and the second copper foil layer are contacting with the insulating layer; removing the second protective layers, which have been respectively formed on the second copper foil layers, and parts of the second copper foil layers; forming via holes by removing parts of the insulating layers through the regions from which the parts of the second copper foil layers have been removed, using laser processing; and forming two double-sided copper-clad laminates by removing the protective layers, which have been respectively formed on one surface of one first copper foil layer and one surface of the other first copper foil layer, and the adhesive layer, wherein each of the first copper foil layers and each of the second copper layers each have a thickness equal to or less than 5 μm.

In the method, the protective layer may be a metallic layer.

In the method, each of the first copper foil layers and each of the second copper foil layers each may have a thickness equal to or less than 5 μm.

In the method, the adhesive layer may be made of material having high heat conductivity.

In the method, the part of each of the second copper foil layers of the removing the protective layers may be removed using an etching process.

The method may further include, after forming two double-sided copper-clad laminates, respectively forming plating layers on the copper-clad laminates.

The method may further include, after forming two double-sided copper clad laminates, filing the via holes with conductive paste.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
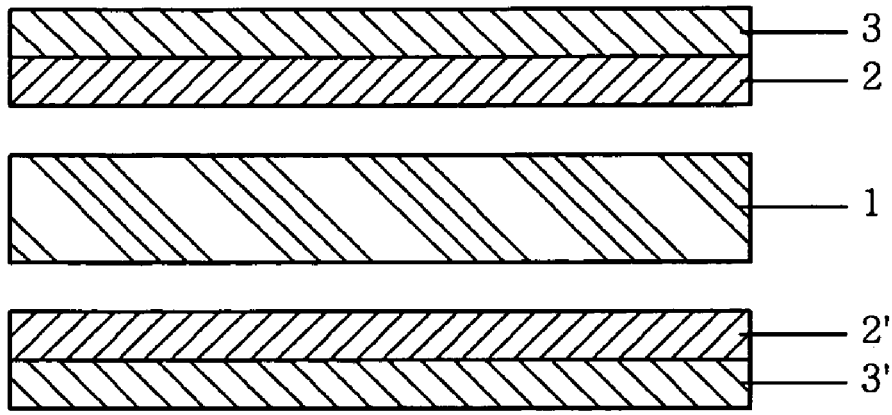
FIGS. 1A to 1F are process diagrams illustrating a prior art method of manufacturing a copper-clad laminate for VOP application.
Figure 1B:
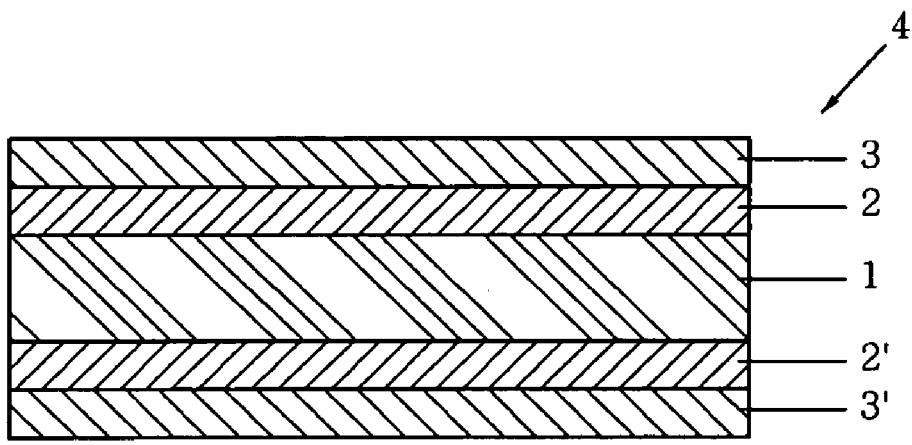
Figure 1C:
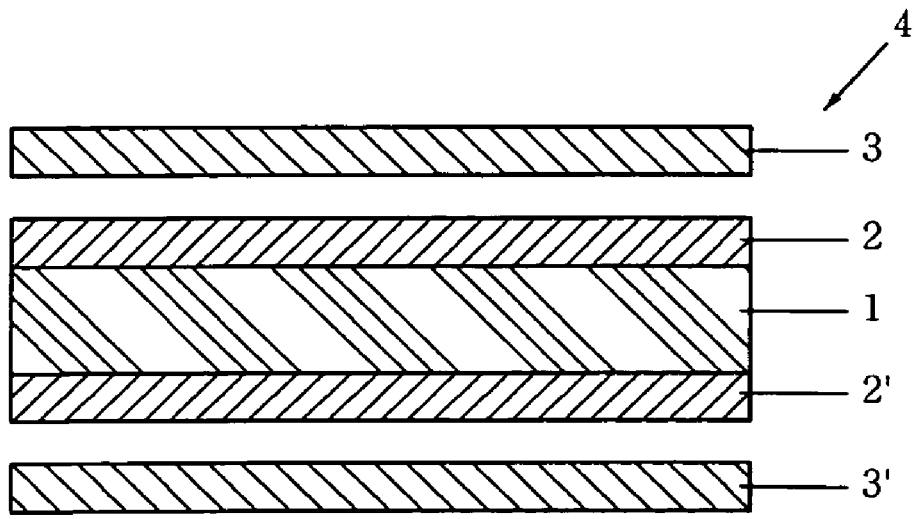
Figure 1D:
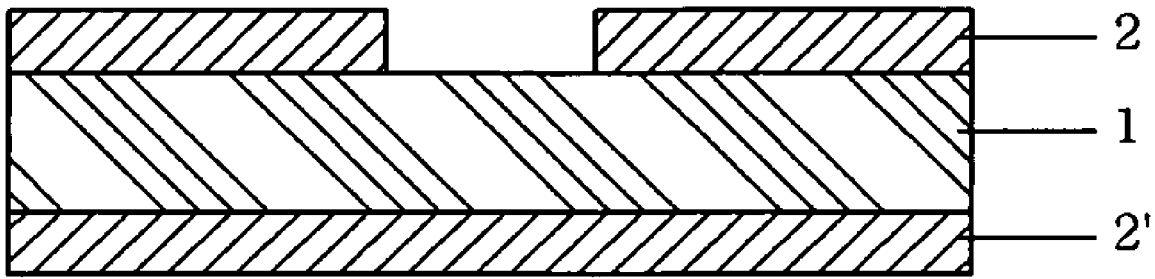
Figure 1E:
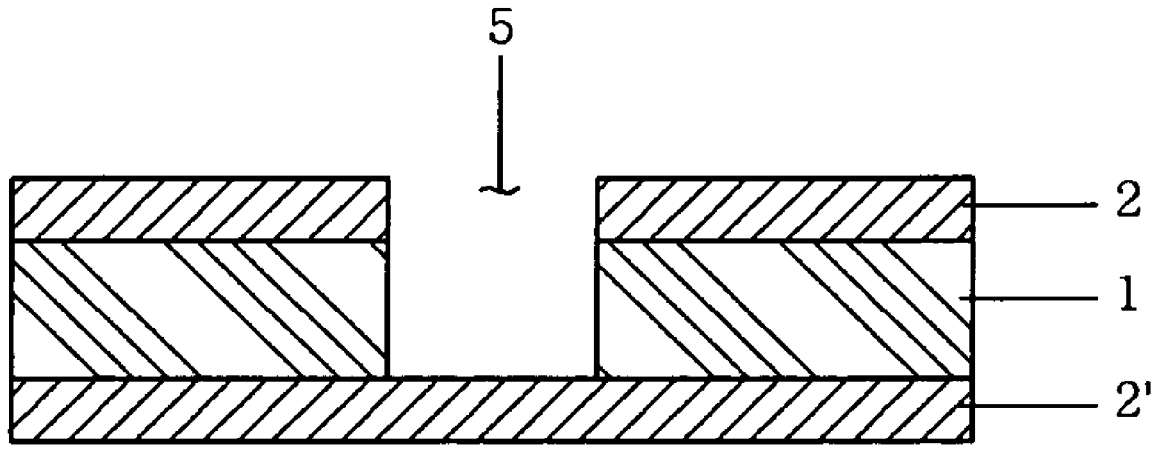
Figure 1F:
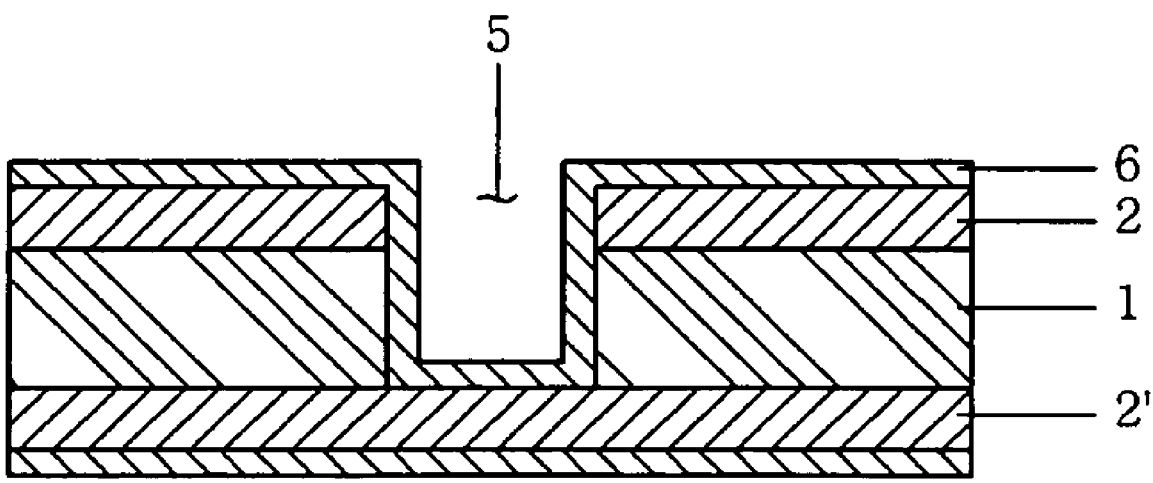
Figure 2:
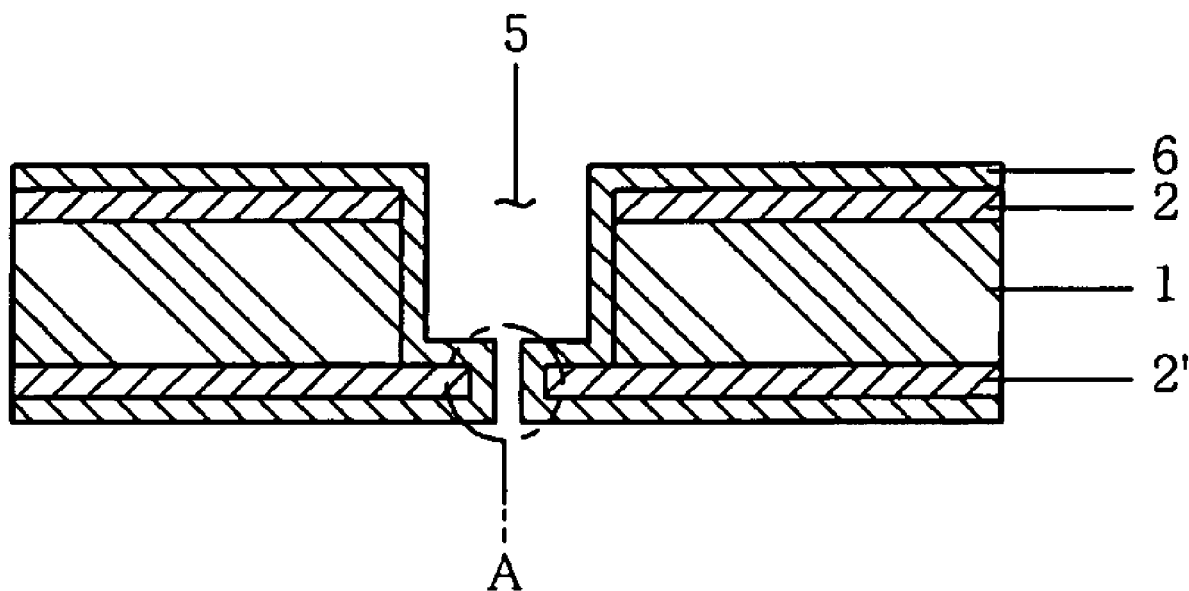
FIG. 2 is a sectional view of a copper-clad laminate for VOP application, which is formed using the prior art method of manufacturing a copper-clad laminate for VOP application, when copper foil layers each have a thickness equal to or less than 5 μm.

Reference now should be made to the drawings, in which the same reference numerals are used throughout the different drawings to designate the same or similar components.

Figure 3:
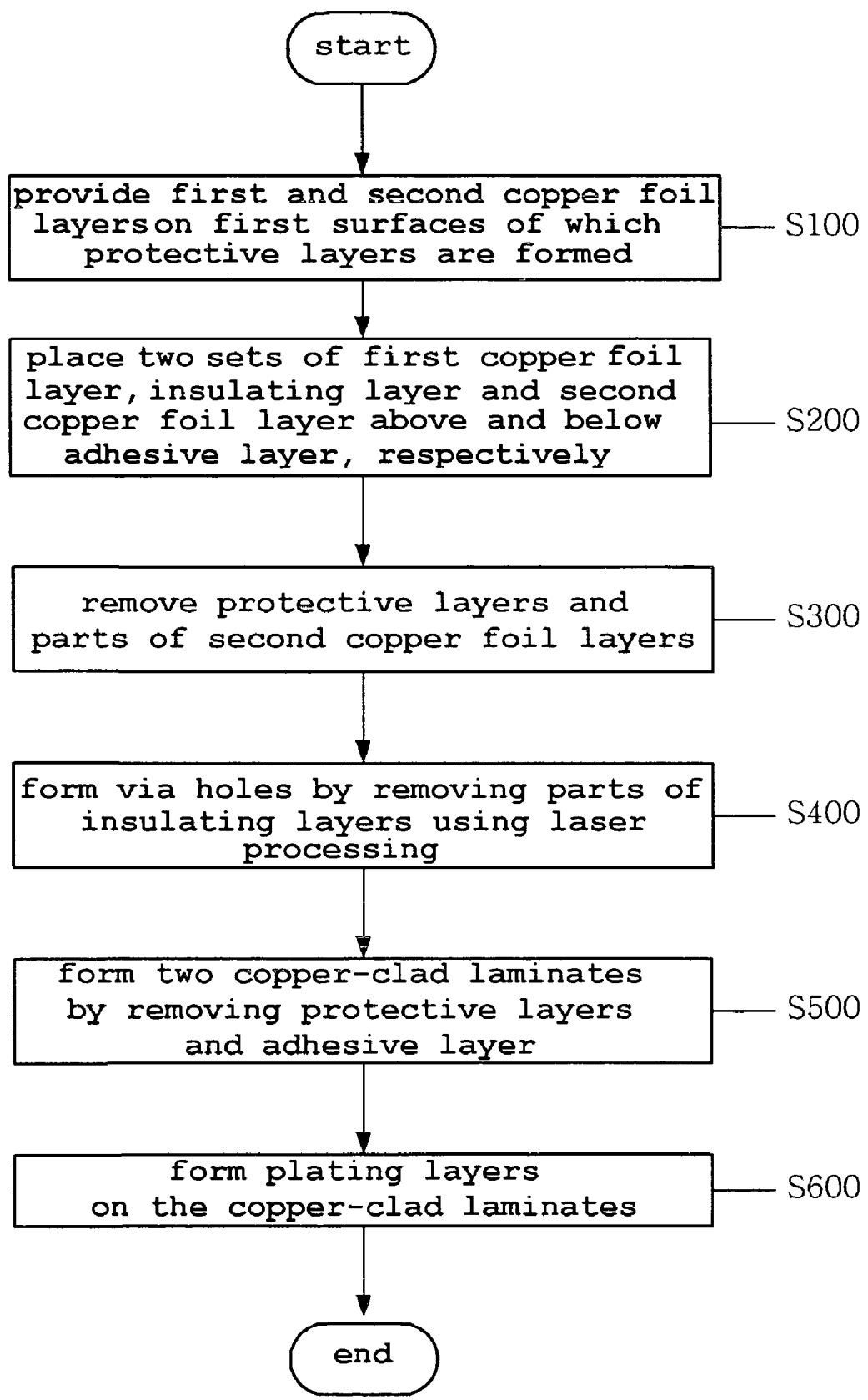
FIG. 3 is a flowchart showing a method of manufacturing a copper-clad laminate for VOP application according to the present invention.

FIG. 3 is a flowchart showing a method of manufacturing a copper-clad laminate for VOP application according to the present invention, and FIGS. 4A to 4I are process diagrams showing the method of manufacturing a copper-clad laminate for VOP application according to the present invention.

First, with reference to FIG. 3, the copper-clad laminate for VOP application according to the present invention is described below.

A first copper foil layer and a second copper foil layer, on one surface of each of which a protective layer is formed, are provided at step S100.

Since there is a risk that the surfaces of the first copper foil layer and the second copper foil layer will be damaged during transport or storage, the first copper foil layer and the second copper foil layer are generally provided, with the protective layers being respectively formed on one surface of the first copper foil layer and one surface of the second copper foil layer.

Such a protective layer is preferably a metallic layer that is made of metal such as copper, nickel, or aluminum.

Thereafter, two sets of a first copper foil layer, an insulating layer and a second copper foil layer are placed above and below an adhesive layer, respectively, at step S200.

In this case, the first protective layer and the second protective layer respectively formed on one surface of the first copper foil layer and one surface of the second copper foil layer are aligned such that they do not come into contact with the insulating layer, and then the elements are laminated together.

Semi-cured prepreg may be used as the adhesive layer. In particular, it is preferred that the adhesive layer be made of adhesive material having high heat conductivity.

Thereafter, the protective layers respectively formed on the second copper foil layers are removed, and parts of the second copper foil layers are removed at step S300.

Thereafter, via holes are formed by removing parts of the insulating layers through the regions from which the parts of the second copper foil layer has been removed, using laser processing at step S400.

That is, the blind via hole can be formed by removing the part of the second copper foil layer from which the protective layer has been removed using etching, and removing the part of the insulating layer through the region from which the part of the second copper foil layer has been removed using laser processing.

In this case, since heat generated during the laser processing can be easily conducted through the protective layer formed on one surface of each of the first copper foil layers, the blind via hole can be easily formed by removing only the insulating layer without damaging the first copper foil layer, even though it has a thickness equal to or less than 5 μm.

Thereafter, two copper-clad laminates are formed by removing the protective layers, which are respectively formed on one surface of one first copper foil layer and one surface of the other first copper foil layer, and the adhesive layer at step S500.

That is, by removing the protective layers, which are respectively formed on one surface of one first copper foil layer and one surface of the other first copper foil layer, and the adhesive layer, the two copper-clad laminates, in which two blind via holes are respectively formed, can be provided.

Finally, copper-clad laminates are realized by forming plating layers on the copper-clad laminates at step S600.

That is, to provide conductivity through the via holes, the plating layers may be formed on the copper-clad laminates. In this case, according to the embodiment, conductivity can be provided by filling the via holes with conductive paste.

With reference to FIGS. 4A to 4I, the method of manufacturing a copper-clad laminate for VOP application according to the present invention is described in detail below.

Figure 4A:
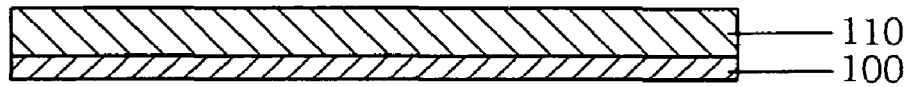
FIGS. 4A to 4I are process diagrams showing the method of manufacturing a copper-clad laminate for VOP application according to the present invention.
Figure 4B:

As illustrated in FIGS. 4A and FIG. 4B, a first copper foil layer 100, on one surface of which a first protective layer 110 is formed, and a second protective layer 130, on one surface of which a second copper foil layer 120 is formed, are provided.

Since there is a risk that the surfaces of the first copper foil layer 100 and the second copper foil layer 120 will be damaged during the transport or storage thereof, a first protective layer 110 and a second protective layer 130 are respectively formed on one surface of the first copper foil layer 100 and one surface of the second copper foil layer 120 to protect them. Furthermore, the first protective layer 110 and the second protective layer 130 according to an embodiment of the present invention may have the effect of facilitating the dissipation of heat during laser processing.

In this case, the first protective layer 110 and the second protective layer 130 are preferably metallic layers each of which has a thickness in a range from 18 μm to 35 μm and is made of metal such as copper, nickel or aluminum. Furthermore, to separate the first copper foil layer 100 and the second copper foil layer 120 from the first copper foil layer 100 and the second copper foil layer 120 in a subsequent process, the first protective layer 110 may be formed on one surface of the first copper foil layer 100 with separating material (not shown) interposed therebetween, and the second protective layer 130 may be formed on one surface of the second copper foil layer 120 with separating material (not shown) interposed therebetween.

In this case, to realize a fine circuit pattern, it is preferred that each of the first copper foil layer 100 and the second copper foil layer 120 be formed of a foil having a thickness equal to or smaller than 5 μm.

Figure 4C:
Figure 4C:
Figure 4C:
Figure 4C:
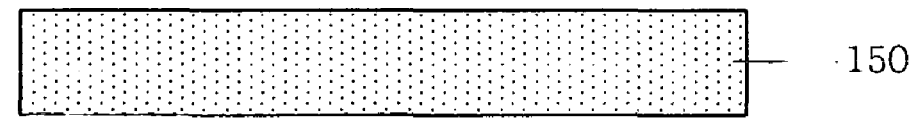
Figure 4C:
Figure 4C:
Figure 4C:
Figure 4D:
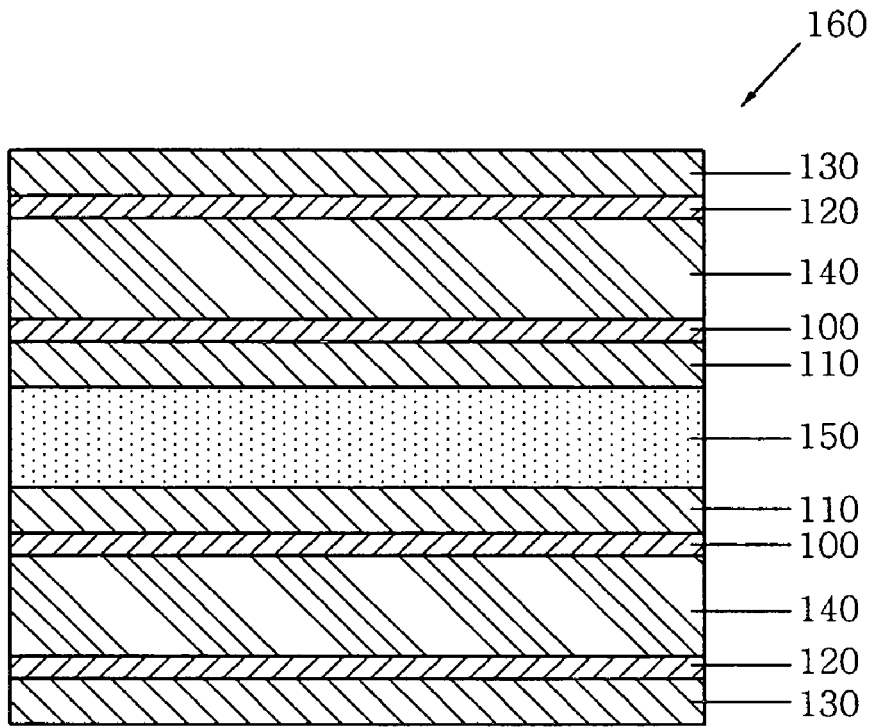

Thereafter, a laminate 160 is formed by arranging two sets of a first copper foil layer 100, an insulating layer 140 and a second copper foil layer 120 above and below an adhesive layer 150, as illustrated in FIG. 4C, and laminating together the elements, as illustrated in FIG. 4D.

In this case, the first protective layer 110 and the second protective layer 130 respectively formed on one surface of the first copper foil layer 100 and one surface of the second copper foil layer 120 must be aligned such that they do not come into contact with the insulating layer 140, and then the elements are laminated together.

Semi-cured prepreg may be used as the adhesive layer 150. In particular, it is preferred that the adhesive layer 150 be made of adhesive material having high heat conductivity.

In the case where the first copper foil layer 100, the insulating layer 140 and the second copper foil layer 120 are placed on only one surface of the adhesive layer 150, a defect may occur, in which the laminate is bent or broken. To prevent the occurrence of the defect, the laminate 160 having a symmetrical structure is formed by placing not only two sets of a first copper foil layer 100, an insulating layer 140 and a second copper foil layer 120 above and below the adhesive layer 150, respectively.

Figure 4E:
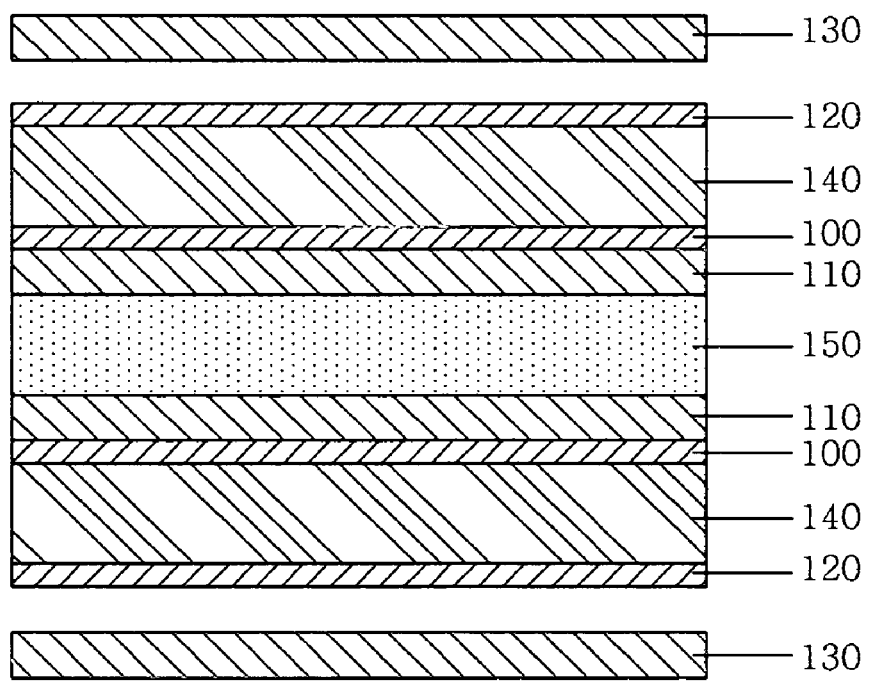

Thereafter, as illustrated in FIG. 4E, the second protective layer 130, which is formed on one surface of each of the second copper foil layers 120 and is placed on the outermost side of the laminate 160, is removed.

Since the separating material is applied between a corresponding pair of a second protective layer 130 and a second copper foil layer 120, the second protective layers 130 may be easily removed using a physical method.

Figure 4F:
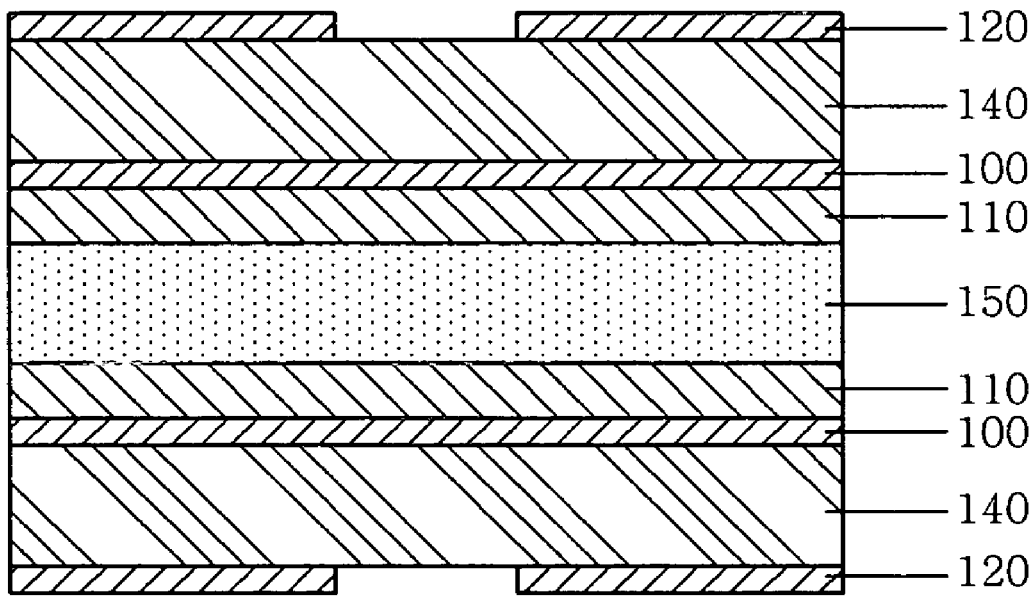

Thereafter, as illustrated in FIG. 4F, part of each of the second copper foil layers 120 is removed.

That is, part of each of the second copper foil layers 120 corresponding to a region in which a via hole will be formed is removed using an etching process or the like, thereby exposing part of each of the insulating layers 140 outside. The etching process is, for example, a process of forming an etching resist pattern using light-sensitive material, removing a copper foil using iron chloride, copper dichloride, an alkali etching solution and a sulfuric acid-based etching solution, and then peeling an etching resist pattern.

Figure 4G:
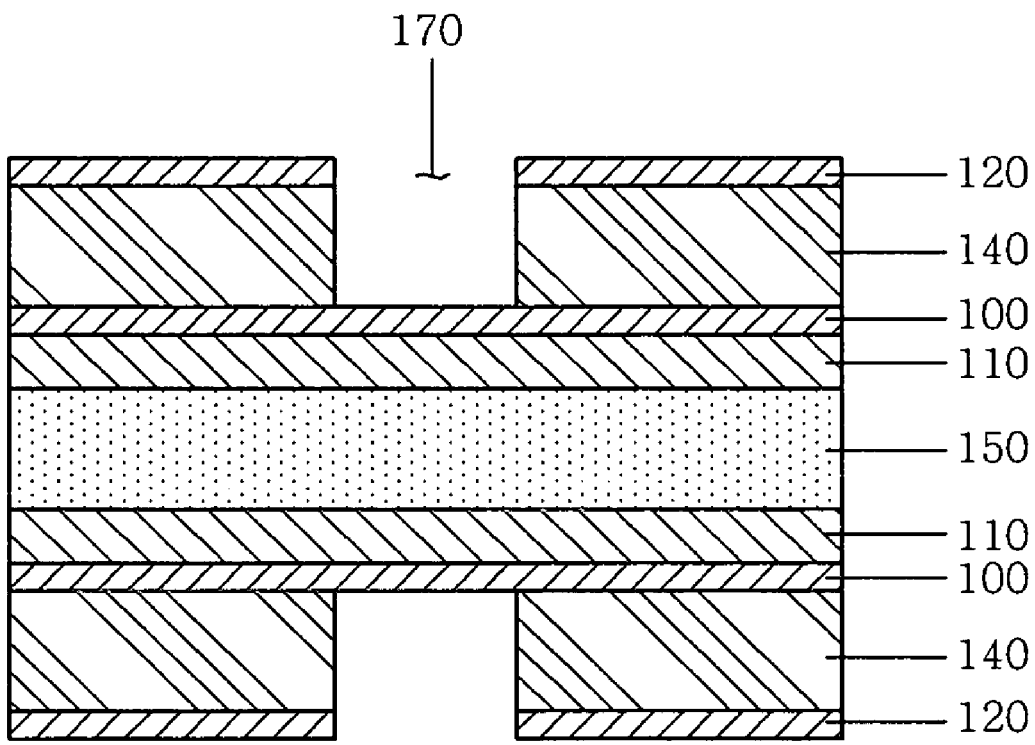

Thereafter, as illustrated in FIG. 4G, a blind via hole 170 is formed through each of the regions from which the part of the second copper foil layer 120 has been removed, using laser processing.

The blind via hole 170, from which the part of each of the insulating layers 140 has been removed, is formed through the region of each of the insulating layers 140, from which the part of the second copper foil layer 120 has been removed and which has been exposed to the outside, using a carbon dioxide ($CO_2$) laser.

The carbon dioxide laser easily attains high power because a specific infrared ray is generated between the oscillation levels of a carbon dioxide molecule, and the efficiency is high.

In this case, since heat generated during carbon dioxide laser processing is easily conducted through the first protective layer 110 formed on each of the first copper foil layers 100, the blind via hole may be formed even on the first copper foil layer 100 having a thickness equal to or less than 1705 μm.

That is, in the prior art manufacturing method, even if control is performed such that heat generated during laser processing passes only through the insulating layers 140 but does not pass through the first copper foil layers 100, the first copper foil layer 100 is easily affected by the heat in the case where the first copper foil layer 100 has a thickness less than 5 μm, therefore a defect, such as a pin hole, occurs. However, according to an embodiment of the present invention, since the first protective layer 110 having a thickness in a range from 18 μm to 35 μm is formed on each of the first copper foil layers 100, heat generated during laser processing can be easily dissipated, therefore the blind via holes 170 can be formed without damaging the first copper foil layers 100.

Figure 4H:
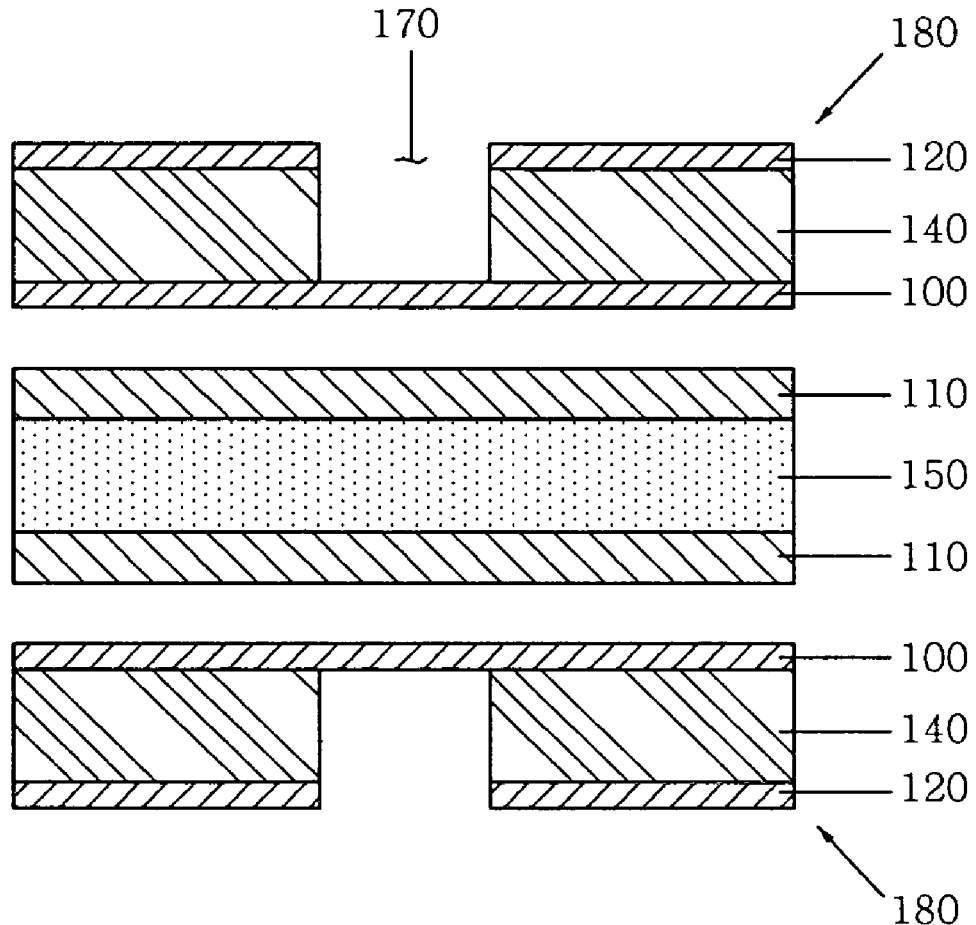

Thereafter, as illustrated in FIG. 4H, two copper-clad laminates 180 are formed by removing the first protective layers 110, which are respectively formed on one side of one first copper foil layer 100 and one side of the other first copper foil layer 100, and the adhesive layer 150.

Since the separating material is applied between the first protective layer 110 and the first copper foil layer 100, the first protective layer 110 and the adhesive layer 150 can be easily removed.

Figure 4I:
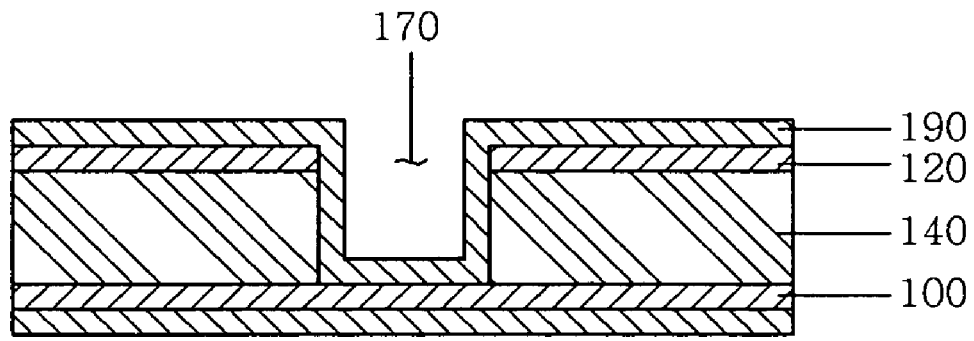

Finally, as illustrated in FIG. 4I, each of the copper-clad laminates for VOP application is realized by forming a plating layer 190 on each of the copper-clad laminates 180.

The via hole 170 is used to electrically connect circuit patterns, which will be respectively formed on the first copper foil layer 100 and the second copper foil layer 120. Conductivity can be provided by forming the plating layer 190 on the via hole 170.

In this case, since the via hole 170 is formed through the insulating layer 140, the plating layer 190 can be formed using electroless copper plating or electrolytic copper plating.

According to the embodiment, conductivity can be provided by filling the via hole 170 with conductive paste (not shown).

In the method of manufacturing a copper-clad laminate for VOP application according to the embodiment of the present invention, heat dissipation layers for aiding the dissipation of heat when the blind via holes 170 are formed on the copper foil layers are not formed through the use of separate reinforcing material or a separate process, but the protective layers 110 and 130 that are formed together with the first copper foil layer 100 and the second copper foil layer 120 are used as the heat dissipation layers, therefore the copper-clad laminates in which the blind via holes 170 are formed can be manufactured without the use of an additional process and additional cost.

As described above, according to the method of manufacturing a copper-clad laminate for VOP application according to the present invention, heat dissipation layers for dissipating heat generated during laser processing are not separately formed, but the protective layers that are formed together with the first and second copper foil layers are used as the heat dissipation layers, therefore the copper-clad laminates, in which the blind via holes are formed, can be manufactured without the use of an additional process and additional cost.

Furthermore, according to the method of manufacturing a copper-clad laminate for VOP application according to the present invention, defects, such as a pin hole, do not occur when a blind via hole is formed on a copper foil layer, therefore a copper-clad laminate for VOP application for the implementation of a fine circuit pattern can be manufactured.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a copper-clad laminate for Via-On-Pad (VOP) application, comprising:
   providing a first copper foil layer and a second copper foil layer, wherein the first copper foil layer has a first protective layer on one surface thereof, and the second copper foil layer has a second protective layer on one surface thereof;
   placing two sets of a first copper foil layer having a first protective layer, an insulating layer and a second copper foil layer having a second protective layer above and below an adhesive layer, respectively so that the first copper foil layer and the second copper foil layer are contacting with the insulating layer, wherein each of the first copper foil layers and each of the second copper foil layers each have a thickness equal to or less than 5 μm;
   removing the second protective layers, which have been respectively formed on the second copper foil layers, and parts of the second copper foil layers;
   forming via holes by removing parts of the insulating layers through the regions from which the parts of the second copper foil layers have been removed, using laser processing; and
   forming two double-sided copper-clad laminates by removing the protective layers, which are respectively formed on one surface of one first copper foil layer and one surface of a remaining first copper foil layer, and the adhesive layer.

2. The method set forth in claim 1, wherein the protective layer is a metallic layer.

3. The method set forth in claim 1, wherein the adhesive layer is made of semi-cured prepreg.

4. The method set forth in claim 1, wherein the part of each of the second copper foil layers is removed using an etching process.

5. The method set forth in claim 1, further comprising, after the forming two double-sided copper-clad laminates:
   respectively forming plating layers on the copper-clad laminates.

6. The method set forth in claim 1, further comprising, after forming two double-sided copper-clad laminates:
   filling the via holes with conductive paste.

* * * * *